(12) United States Patent
Perry et al.

(10) Patent No.: US 9,476,944 B2
(45) Date of Patent: Oct. 25, 2016

(54) INSULATION INSPECTION INSTRUMENT

(71) Applicant: GM GLOBAL TECHNOLOGY OPERATIONS LLC, Detroit, MI (US)

(72) Inventors: Thomas A. Perry, Bruce Township, MI (US); John D. Campbell, Rochester Hills, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 555 days.

(21) Appl. No.: 13/916,483

(22) Filed: Jun. 12, 2013

(65) Prior Publication Data

US 2014/0368233 A1  Dec. 18, 2014

(51) Int. Cl.
*G01R 31/34* (2006.01)
*H02K 15/00* (2006.01)

(52) U.S. Cl.
CPC ............. *G01R 31/34* (2013.01); *G01R 31/346* (2013.01); *H02K 15/00* (2013.01)

(58) Field of Classification Search
CPC .. G01R 31/343; G01R 31/34; G01R 31/346; G01R 31/025; G01R 31/40
See application file for complete search history.

(56) References Cited

U.S. PATENT DOCUMENTS

| | | | | |
|---|---|---|---|---|
| 5,291,128 | A | * 3/1994 | Shekar | G01R 31/343 318/490 |
| 5,336,993 | A | * 8/1994 | Thomas | G01R 31/40 324/765.01 |
| 5,397,996 | A | 3/1995 | Keezer | |
| 5,907,244 | A | * 5/1999 | Crabill | G01R 31/346 324/545 |
| 6,611,771 | B1 | * 8/2003 | Habetler | H02H 1/0092 324/546 |

\* cited by examiner

*Primary Examiner* — Tung X Nguyen
(74) *Attorney, Agent, or Firm* — John A. Miller; Miller IP Group, PLC

(57) ABSTRACT

A continuity tester that has particular application for inspecting the insulation on the stator windings in an electric machine. The continuity tester includes a power supply, a brush having conductive bristles, and an analog-to-digital (A/D) converter. One terminal of the power supply is electrically coupled to the brush and another terminal of the power supply is electrically coupled to the A/D converter and the stator being tested. The conductive brush is selectively positioned against the exposed windings of the stator, and if an electrical circuit is formed as a result of loss of insulation, the potential at the input of the A/D converter drops, which can be detected. In one embodiment, the conductive brush is a manual brush that is moved across the stator windings, and in alternate embodiments the conductive brush is specially configured to be positioned against the conductive windings in an automated process.

18 Claims, 3 Drawing Sheets

INSULATION INSPECTION INSTRUMENT

BACKGROUND OF THE INVENTION

1. Field of the Invention

This invention relates generally to a continuity tester and, more particularly, to a continuity tester including a specially configured conductive brush that has particular application for inspecting insulation damage on stator windings in an electric machine.

2. Discussion of the Related Art

Various types of electric machines are employed in vehicles to provide certain vehicle operations. For example, electric vehicles or electric hybrid vehicles employ traction motors that are often three-phase electric machines including a stator having a series of circumferentially disposed slots and a rotor having a series of circumferentially disposed conductors. Electrical windings are provided within the stator slots in a configuration to provide the three separate circuits for the three phases, where the windings may include conductive bars positioned in the slots. The conductive bars include an outer insulating layer typically formed by depositing multiple coatings of a non-conductive material.

During assembly of electric machines of this type, workers will handle the stator to configure and connect the various machine elements in an assembly process. During handling, the stator may be inadvertently bumped or rubbed against assembly equipment and other things, where nicks, cuts, abrasions and other defects sometimes occur in the insulation of the stator windings, which could expose the conductive part of the winding. For example, once the stator is assembled, the process of positioning the rotor within a central bore of the stator may damage the stator windings at various locations. Such defects in the insulation of the stator windings sometimes affect machine performance and could result in an unacceptable shorter machine life.

Various inspection operations can be performed to identify damage and defects to the insulation of the stator windings. For example, visual inspections can be performed where a quality control technician using a magnifying glass looks for defects in the insulation. Such an inspection operation is obviously labor intensive, and is subject to the limitations of the technician. It is also known in the art to employ a continuity tester that provides an electrical current through the stator windings, where the circuit is continuous at the location where the defect in the insulation occurs. Some continuity testers employ significantly high voltages to ensure that small defects are detected. However, known continuity testers, including those having a conductive brush, can be improved upon to increase the ability to safely detect smaller defects, provide automated testing, provide faster response times, etc.

SUMMARY OF THE INVENTION

In accordance with the teachings of the present invention, a continuity tester is disclosed that has particular application for inspecting the insulation on the stator windings in an electric machine. The continuity tester includes a power supply, a brush having conductive bristles, and an analog-to-digital (A/D) converter. One terminal of the power supply is electrically coupled to the brush and another terminal of the power supply is electrically coupled to the A/D converter and the stator being tested. The conductive brush is selectively positioned against the exposed windings of the stator, and if an electrical circuit is formed as a result of loss of insulation, the potential at the input of the A/D converter drops, which can be detected. In one embodiment, the conductive brush is a manual brush that is moved across the stator windings, and in alternate embodiments the conductive brush is specially configured to be positioned against the conductive windings in an automated process.

Additional features of the present invention will become apparent from the following description and appended claims, taken in conjunction with the accompanying drawings.

DETAILED DESCRIPTION OF THE EMBODIMENTS

The following discussion of the embodiments of the invention directed to a continuity tester is merely exemplary in nature, and is in no way intended to limit the invention or its applications or uses. For example, as discussed herein, the continuity tester of the invention has particular application for identifying defects in the insulation of stator windings of an electric machine. However, as will be appreciated by those skilled in the art, the continuity tester of the present invention may have application for testing other devices.

Figure 1:
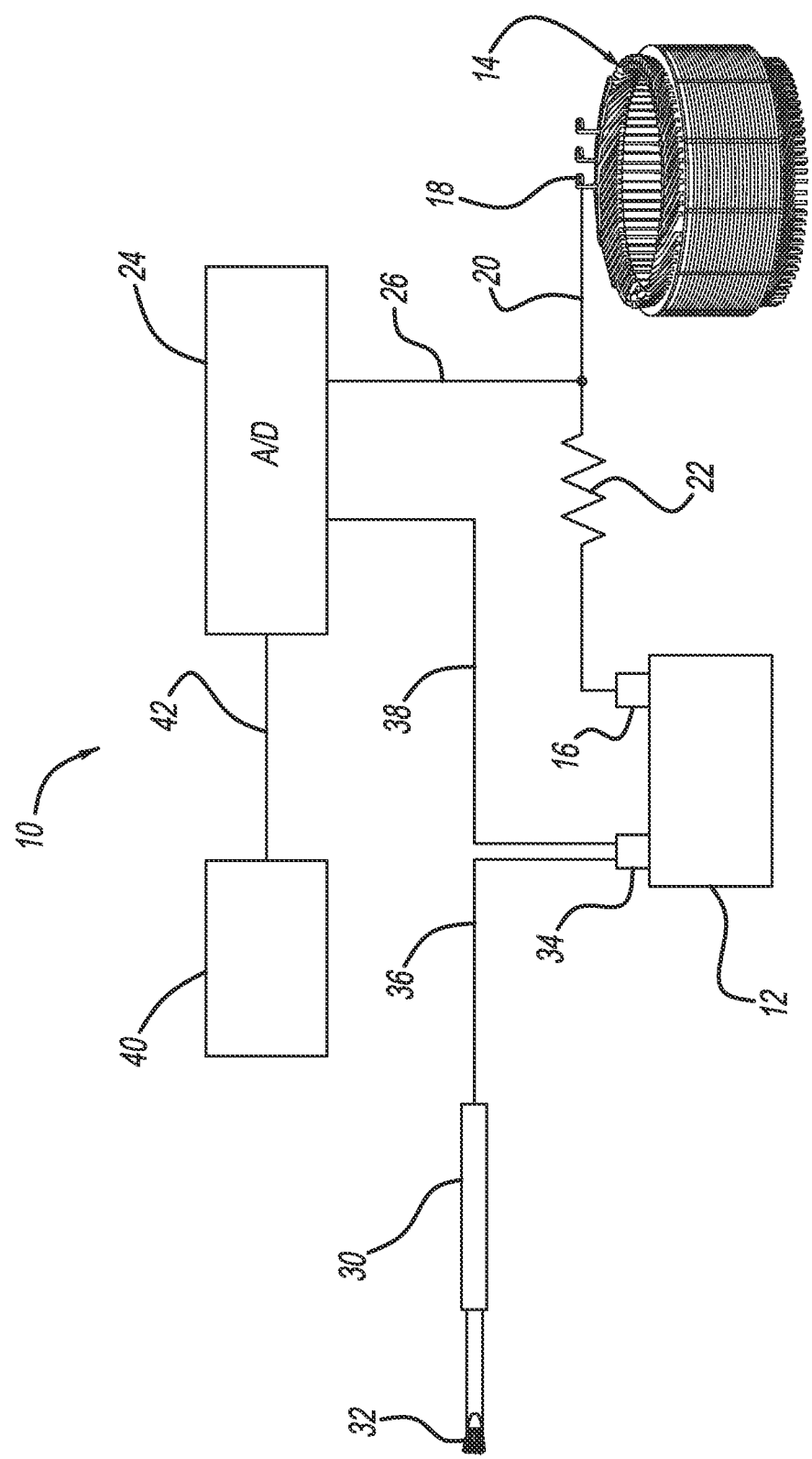
FIG. 1 is a schematic block diagram of a continuity tester electrically coupled to a stator of an electric machine.

FIG. 1 is a schematic block diagram of a continuity tester 10 including a power source, such as a battery 12. As will be discussed in detail below, the continuity tester 10 is being used to detect defects in the insulation of stator windings in an electric machine stator 14. The battery 12 can provide any suitable voltage level for a particular continuity test. In one non-limiting embodiment, the battery 12 provides 24 volts as being a potential below what is normally considered an unsafe potential, but high enough to detect small enough defects in the stator windings. A positive terminal 16 of the battery 12 is electrically coupled to a terminal 18 of the stator 14 on line 20. The terminal 18 is one of three terminals of the stator 14, one for each of the three phase circuits of the machine. A current limiting resistor 22, for example, 24000Ω, is provided in the line 20 for safety purposes. In an alternate embodiment, a more sophisticated power source can provide the current limitation. The continuity tester 10 also includes an A/D converter 24 having an input electrically coupled to the positive terminal 16 of the battery 12 by line 26. The continuity tester 10 further includes a brush 30 having conductive bristles 32 that is electrically coupled to a negative terminal 34 of the battery 12 by line 36. The bristles 32 can be made of any suitable conductive material, such as carbon fibers, silver coated fibers, fine metal wires, etc. The size of the bristles 32 is selected for the general size of the defects that are being identified. The ground connection of the A/D converter 24 is also electrically coupled to the negative terminal 34 of the battery 12 by line 38. The continuity tester 10 also includes a processing device or controller 40, such as a laptop computer, connected to the A/D converter 18 by line 42 that provides an indication of a failure, as will be discussed below.

Figure 2:
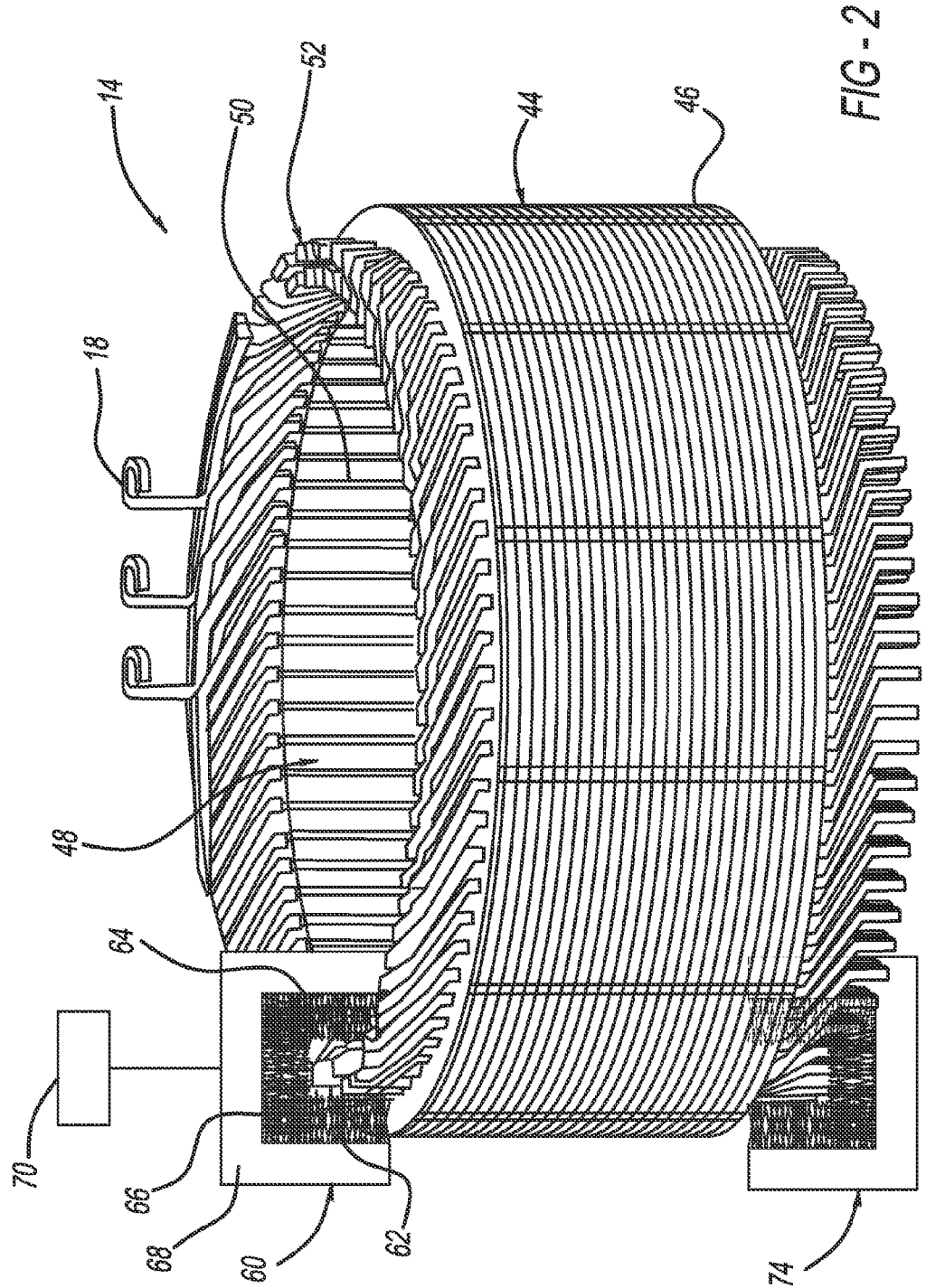
FIG. 2 is a perspective view of the stator of the electric machine showing U-shaped brushes positioned relative thereto.

FIG. 2 is a perspective view of the machine stator 14 separated from the continuity tester 10. The stator 14 includes a stator core 44 comprised of a series of stacked laminate plates 46 defining an internal bore 48 in a manner well understood by those skilled in the art. Each laminate plate 46 includes a series of circumferentially disposed notches through an internal surface that when combined with the notches from all of the plates 46 forms circumferentially disposed stator slots 50 around the internal bore 48. In this non-limiting design, the stator 14 includes a number of conductive stator bars 52 that extend through the slots 50 and that have specially configured ends that allow the bars 52 to be electrically coupled together to form the windings of the three-phase circuits, where each terminal 18 is an electrical connection to one of the circuits. In this particular design, each of the slots 50 includes four of the stator bars 52 extending therethrough, where two of the bars 52 are provided by a single length of metal, which forms two rows each having two of the bars 52. Particularly, each combination of two of the stator bars 52 forming one of the rows at the top end of the stator 14 have a hair pin configuration and the stator bars 52 have a twisted electrical connection at the bottom end of the stator 14 to form the electrical circuits. In one non-limiting embodiment, each bar 52 has a cross-sectional dimension of about 3.4 mm×3.6 mm.

As mentioned above, the stator bars 52 are conductive and are covered with multiple coatings forming insulation thereon. The ends of the bars 52 that extend out of the slots 50 could possibly become damaged during assembly of the electric machine, where the insulation could be nicked and the conductive under-portion of the bar 52 be exposed. This is more likely to happen at the inside surface of the inner row of the stator bars 52 or the outside surface of the outer row of the stator bars 52. Therefore, it is these areas that inspections are often performed to identify potential failures.

As will be discussed below, the present invention proposes two general types of continuity testers, a manual continuity tester and an automated continuity tester. The continuity tester 10 is a manual tester in that the technician holds the brush 30 and then runs the conductive bristles 32 along the exposed surfaces of the bars 52. If the insulation on the bars 52 is intact, the conductive bristles 32 will not form a circuit where the resistance between the bristles 32 and the conductive portion of the bars 52 is high, effectively an open circuit. In this situation, the input of the A/D converter 24 is maintained high at the potential of the positive terminal 16 of the battery 12. If one or more of the bristles 32 touches the conductive portion of the bar 52 as a result of the insulation being damaged, then a conductive path is formed between the positive terminal 16 and the negative terminal 34 of the battery 12. This current flow drops the voltage at the input of the A/D converter 24 low, which is detected by the controller 40.

The size of the bristles 32 can be provided to detect the smallest reasonable size of a defect in a particular stator bar 52. For a battery voltage of 24 volts, the exposed open area of the bar 52 must be larger than the bristle diameter in order to provide electrical contact. In one particular design, the size of the bristle 32 is such that a minimum detectable size of a defect in the insulation is about 0.01 mm×0.03 mm. Further, the controller 40 can set a voltage threshold for triggering the alarm. Particularly, a threshold value can be selectively set where the input voltage of the A/D converter 24 must fall below the threshold before the alarm is triggered. Further, the controller 40 can be set for different response times, such as 10 mS.

As mentioned above, the continuity tester 10 provides a manual inspection process where the technician is required to move the brush 30 along the bars 52. In this design, it is desirable to have a lower power supply voltage to reduce the likelihood that the technician is harmed. In an alternate embodiment, the brush 30 can be replaced with other types of brushes that can be used in an automated testing procedure.

Returning to FIG. 2, a specially configured U-shape brush assembly 60 is shown including first and second side electrically conductive brushes 62 and 64 and a top electrically conductive brush 66 mounted to a U-shaped frame 68. The brush assembly 60 is appropriately dimensioned for a particular sized stator and is placed over the top ends of all of the bars 52 so that the first side brush 62 contacts the outer surface of the outer row of the bars 52, the second side brush 64 contacts the inner surface of the inner row of the bars 52, and the top brush 66 contacts the top surface of all of the bars 52. A suitable automated device, represented generally by box 70, controls the position of the brush assembly 60 and provides an electrical connection between the battery 12 and the brushes 62-66, where the device 70 rotates the brush assembly 60 around the bars 52 in an automated testing process. Thus, a technician is not required to hold or move the brush assembly 60. As the brush assembly 60 is rotated, the controller 40 will monitor the input of the A/D converter 24. If one of the bristles of the brushes 62-66 contacts a defect in the insulation and an electrical circuit is formed where the input voltage of the A/D converter 24 drops, as discussed above, the controller 40 can provide an alarm indicating a defect. The controller 40 can also monitor the position of the brush assembly 60 so that the defect can be located. Alternately, the stator 14 can be rotated instead of the brush assembly 60.

Another brush assembly 74 is shown positioned around the bottom ends of the conductor bars 52 in FIG. 2 and can operate in the same manner as the brush assembly 60 for that section of the bars 52. Those skilled in the art well readily appreciate that the brush assemblies 60 and 74 can be mechanically coupled together so that they rotate around the stator bars 52 simultaneously, and be simultaneously electrically coupled to the battery 12. Alternately, a single brush assembly can be employed where it may first inspect the top ends of the conductor bars 52, and then be repositioned to inspect the bottom ends of the conductor bars 52.

Figure 3:
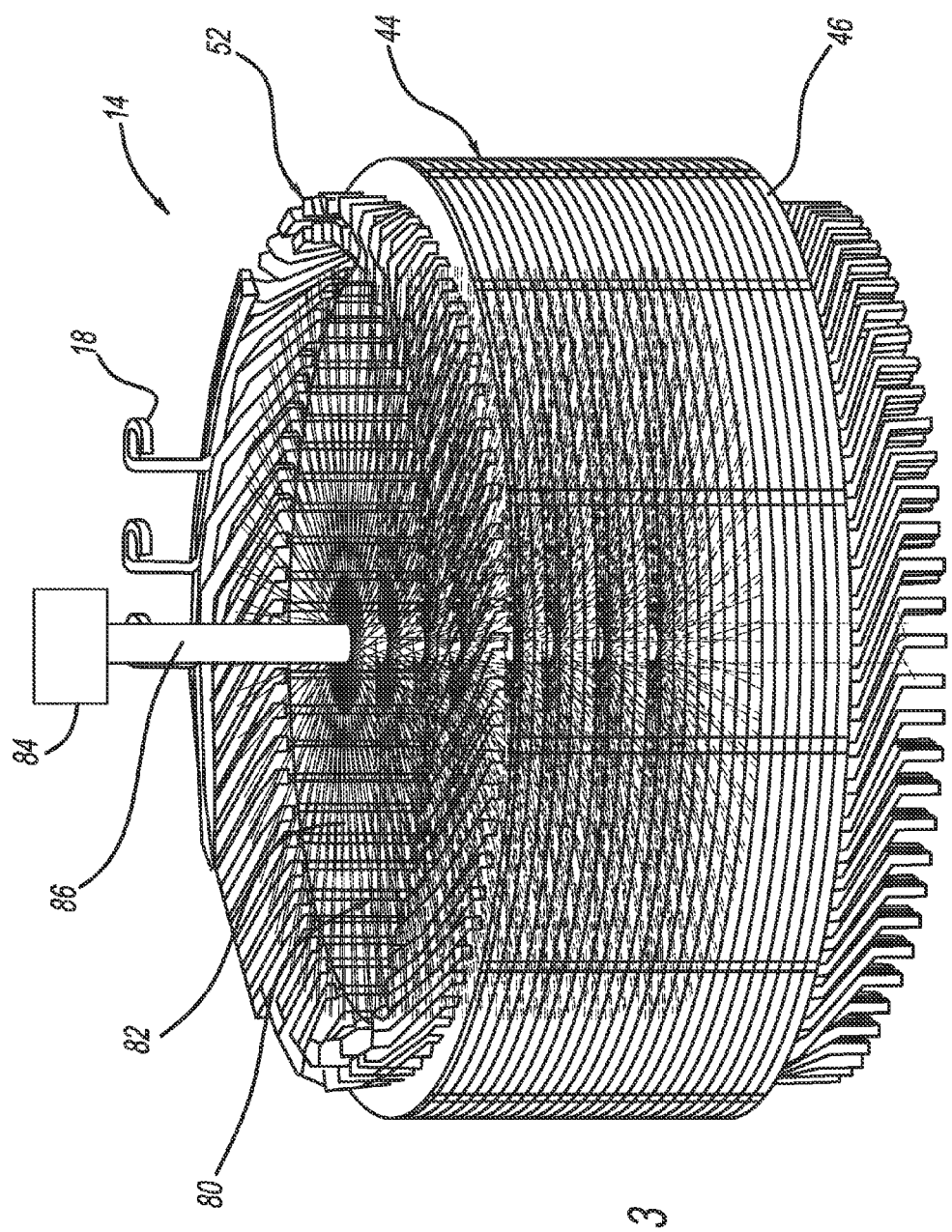
FIG. 3 is a perspective view of the stator of the electric machine showing a conductive brush positioned within the stator.

FIG. 3 is another perspective view of the stator 14 showing a column brush 80 inserted into the bore 48 of the stator core 44, where the brush 80 has electrically conductive bristles 82 that extend in all directions. The brush 80 is rotated by a device, represented generally by box 84, connected to the brush 80 by shaft 86 so that the bristles 82 rub against the inside surface of the inner row of the bars 52. The device 84 also provides the electrical connection between the bristles 82 and the battery 12. As the brush 80 is rotated, the bristles 82 will contact different locations of the bars 52 to help identify defects therein. The device 84 may not be able to identify the specific location of the defect, but will be able to identify that a defect does exist.

As will be well understood by those skilled in the art, the several and various steps and processes discussed herein to describe the invention may be referring to operations performed by a computer, a processor or other electronic calculating device that manipulate and/or transform data using electrical phenomenon. Those computers and electronic devices may employ various volatile and/or non-volatile memories including non-transitory computer-readable medium with an executable program stored thereon including various code or executable instructions able to be performed by the computer or processor, where the memory and/or computer-readable medium may include all forms and types of memory and other computer-readable media.

The foregoing discussion disclosed and describes merely exemplary embodiments of the present invention. One skilled in the art will readily recognize from such discussion and from the accompanying drawings and claims that various changes, modifications and variations can be made therein without departing from the spirit and scope of the invention as defined in the following claims.

What is claimed is:

1. A continuity tester for detecting defects in an electrical device, said tester comprising:
    a power supply including a first terminal and a second terminal, wherein the first terminal is electrically coupled to the device;
    an analog-to-digital (A/D) converter including an input electrically coupled to the first terminal of the power supply;
    a brush including a plurality of electrically conductive bristles being configured to contact the device; and
    a controller electrically coupled to the A/D converter, said A/D converter providing a signal to the controller in response to a low signal at the input when the conductive bristles make electrical contact with the device, wherein the device is a stator of an electric machine, said stator including stator windings having conductive bars extending from a stator core, and wherein a size of the conductive bristles is effective to make electrical contact with defects formed in an insulating layer on the stator windings.

2. The continuity tester according to claim 1 wherein the brush is a hand-held brush operable to be handled by a technician.

3. The continuity tester according to claim 1 wherein the brush is a brush assembly having a U-shape configuration where first and second side brushes of the brush assembly are operable to be positioned at inside and outside surfaces of the conductor bars and a top brush of the brush assembly is operable to be positioned at a top surface of the conductor bars.

4. The continuity tester according to claim 3 further comprising a system for moving the brush assembly in an automated process.

5. The continuity tester according to claim 1 wherein the brush is a column brush including a central shaft having circumferentially disposed bristles, said brush being effective to be inserted into a center bore of the stator and contact the stator windings.

6. The continuity tester according to claim 5 further comprising a system for moving the column brush in an automated process.

7. The continuity tester according to claim 1 wherein the controller is a laptop computer.

8. The continuity tester according to claim 1 wherein the controller provides a response time of 10 mS.

9. The continuity tester according to claim 1 wherein the controller provides an alarm in response to the low signal at the input.

10. The continuity tester according to claim 9 wherein the controller provides a variable threshold for when to provide the alarm in response to the low signal at the input.

11. The continuity tester according to claim 1 wherein the bristles have a size that allows the tester to identify defects having a size of about 0.01 mm ×0.03 mm.

12. The continuity tester according to claim 1 wherein the power supply provides 24 volts.

13. The continuity tester according to claim 1 further comprising a current limiting resistor positioned between the power supply and the A/D converter and the power supply and the device.

14. A continuity tester for detecting defects in stator windings in a stator of an electric machine, said stator windings including conductive bars extending from a stator core, said tester comprising:
    a power supply including a first terminal and a second terminal, wherein the first terminal is electrically coupled to the stator windings;
    an analog-to-digital (A/D) converter including an input electrically coupled to the first terminal of the power supply;
    a brush assembly including a plurality of electrically conductive bristles being configured to contact the stator windings;
    a controller electrically coupled to the A/D converter; and
    an automated device for moving the brush assembly relative to the stator windings, said A/D converter providing a signal to the controller in response to a low signal at the input when the conductive bristles make electrical contact with the stator windings, wherein a size of the conductive bristles is effective to make electrical contact with defects formed in an insulating layer of the stator windings.

15. The continuity tester according to claim 14 wherein the brush assembly has a U-shape where first and second side brushes of the brush assembly are operable to be positioned at inside and outside surfaces of the conductor bars and a top brush of the brush assembly is operable to be positioned at a top surface of the conductor bars.

16. The continuity tester according to claim 14 wherein the brush assembly is a column brush including a central shaft having circumferentially disposed bristles, said brush being effective to be inserted into a bore of the stator and contact the stator windings.

17. The continuity tester according to claim 14 wherein the bristles have a size that allows the tester to identify defects having a size of about 0.01 mm×0.03 mm.

18. The continuity tester according to claim 14 wherein the controller provides a response time of 10 mS.

* * * * *